United States Patent
Tabery et al.

(10) Patent No.: US 6,605,514 B1
(45) Date of Patent: Aug. 12, 2003

(54) PLANAR FINFET PATTERNING USING AMORPHOUS CARBON

(75) Inventors: Cyrus E. Tabery, Sunnyvale, CA (US); Scott A. Bell, San Jose, CA (US); Srikanteswara Dakshina-Murthy, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/237,824

(22) Filed: Sep. 9, 2002

Related U.S. Application Data

(60) Provisional application No. 60/399,781, filed on Jul. 31, 2002.

(51) Int. Cl.[7] .................. H01L 21/336; H01L 21/4763
(52) U.S. Cl. ................. 438/303; 438/304; 438/595; 438/596
(58) Field of Search .................. 438/303–304, 438/595–596, FOR 193

(56) References Cited

U.S. PATENT DOCUMENTS

| | | | |
|---|---|---|---|
| 4,697,333 A | 10/1987 | Nakahara | |
| 4,994,866 A | 2/1991 | Awano | |
| 5,019,882 A | 5/1991 | Solomon et al. | |
| 5,155,571 A | 10/1992 | Wang et al. | |
| 5,461,250 A | 10/1995 | Burghartz et al. | |
| 5,683,934 A | 11/1997 | Candelaria | |
| 5,753,541 A | 5/1998 | Shimizu | |
| 5,766,989 A | 6/1998 | Maegawa et al. | |
| 6,022,785 A | 2/2000 | Yeh et al. | |
| 6,133,082 A | 10/2000 | Masuoka | |
| 6,232,622 B1 | 5/2001 | Hamada | |
| 6,268,640 B1 | 7/2001 | Park et al. | |

OTHER PUBLICATIONS

A. Grill, "Plasma–Deposited Diamondlike Carbon Materials," IBM Journal of Research and Development, vol. 43, 1/2,1999.

Huang eta l., "Sub–50 nm P–Channel FinFET," IEEE Transactions on Electron Devices, vol. 48, No. 5, May 2001, pp. 880–886.

*Primary Examiner*—George Fourson
*Assistant Examiner*—Thanh Pham
(74) *Attorney, Agent, or Firm*—Foley & Lardner

(57) ABSTRACT

An exemplary embodiment relates to a method of finFET patterning. The method can include patterning a fin structure above a substrate, forming amorphous carbon spacers along lateral sidewalls of the fin structure, depositing an oxide layer and polishing the oxide layer to expose top portions of the fin structure and the amorphous carbon spacers, removing amorphous carbon spacers, and depositing polysilicon where the amorphous carbon spacers were located.

20 Claims, 4 Drawing Sheets

PLANAR FINFET PATTERNING USING AMORPHOUS CARBON

CROSS-REFERENCE TO RELATED APPLICATIONS

This application claims priority to U.S. Provisional Application No. 60/399,781, filed on Jul. 31, 2002.

FIELD OF THE INVENTION

The present invention relates generally to integrated circuits (ICs) and methods of manufacturing integrated circuits. More particularly, the present invention relates to a method of manufacturing integrated circuits having planar transistors with a fin-shaped channel region.

BACKGROUND OF THE INVENTION

Integrated circuits (ICs), such as, ultra-large-scale integrated (ULSI) circuits, can include as many as one million transistors or more. The ULSI circuit can include complementary metal oxide semiconductor (CMOS) field effect transistors (FETS). The transistors can include semiconductor gates disposed above a channel region and between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-inducted barrier-lowering. Shallow source and drain extensions, and hence controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process introduces dopants into a thin region just below the top surface of the substrate to form the drain and source extensions as well as to partially form the drain and source regions.

After the drain and source extensions are formed, silicon dioxide spacers, which abut lateral sides of the gate structure, are provided over the source and drain extensions. With the silicon dioxide spacers in place, the substrate is doped a second time to form deep source and drain regions. During formation of the deep source and drain regions, further doping of the source and drain extensions is inhibited due to the blocking characteristic of the silicon dioxide spacers. The deep source and drain regions are necessary to provide sufficient material to connect contacts to the source and drain regions.

As transistors become smaller, it is desirous to increase the charge carrier mobility in the channel region. Increasing charge carrier mobility increases the switching speed of the transistor. Channel regions formed from materials other than silicon have been proposed to increase charge carrier mobility. For example, conventional thin film transistors which typically utilize polysilicon channel regions have been formed on a silicon germanium (Si—Ge) epitaxial layer above a glass ($SiO_2$) substrate. The Si—Ge epitaxial layer can be formed by a technique in which a semiconductor thin film, such as, an amorphous silicon hydride (a-Si:H), an amorphous germanium hydride (a-Ge:H) or the like is melted and crystallized by the irradiation of pulse laser beams.

In a bulk type device, such as, a metal oxide semiconductor field effect transistor (MOSFET), the use of Si—Ge materials could be used to increase charge carrier mobility, especially hole-type carriers. A tensile strained silicon channel region, such as, a silicon channel containing germanium, can have carrier mobility 2–5 times greater than a conventional Si channel region due to reduced carrier scattering and due to the reduced mass of holes in the germanium-containing material. According to conventional Si—Ge formation techniques for bulk-type devices, a dopant implant molecular beam epitaxy (MBE) technique forms a Si—Ge epitaxial layer. However, the MBE technique requires very complicated, very expensive equipment and is not feasible for mass production of ICs.

Double gate transistors, such as, double gate silicon-on-insulator (SOI) transistors have significant advantages related to high drive current and high immunity to short channel effects. An article by Huang, et al. entitled "Sub-50 nm FinFET: PMOS", (1999 IEDM) discusses a silicon transistor in which the active layer is surrounded by a gate on two sides. However, double gate structures can be difficult to manufacture using conventional IC fabrication tools and techniques. Further, patterning can be difficult because of the topography of silicon fin. At small critical dimensions, patterning may be impossible.

By way of example, a fin structure can be located over a layer of silicon dioxide. The fin structure can have located above it several different layers, including a photoresist layer, a bottom anti-reflective coating (BARC) layer, and a polysilicon layer. Various problems can exist with such a configuration. The photoresist layer may be thinner over the fin structure. In contrast, the polysilicon layer may be very thick at the edge of the fin structure. The BARC may be thick at the edge of the fin structure. Such a configuration leads to large over etch requirements for the BARC layer and the polysilicon layer. Such requirements increase the size of the transistor.

Thus, there is a need for an integrated circuit or electronic device that includes channel regions with higher channel mobility, higher immunity to short channel effects and higher drive current. Further, there is a need for patterning finFET devices having small critical dimensions. Even further, there is a need for using amorphous carbon in patterning finFET devices.

SUMMARY OF THE INVENTION

An exemplary embodiment relates to a method of finFET patterning. The method can include patterning a fin structure above a substrate, forming amorphous carbon spacers along lateral sidewalls of the fin structure, depositing an oxide layer and polishing the oxide layer to expose top portions of the fin structure and the amorphous carbon spacers, removing amorphous carbon spacers, and depositing polysilicon where the amorphous carbon spacers were located.

Another exemplary embodiment relates to a method of finFET gate patterning. The method can include providing amorphous carbon spacers adjacent a fin structure, providing a layer of oxide adjacent the amorphous carbon spacers, removing the amorphous carbon spacers, and forming a gate structure above the fin structure and where the amorphous carbon spacers were located.

Another exemplary embodiment relates to a patterning method. The method can include forming a fin structure having a silicon portion and silicon dioxide portion, forming spacers adjacent lateral sidewalls of the fin structure, forming a layer adjacent to and co-planar with the spacers, removing the spacers, and depositing polysilicon where the spacers were located. The fin structure has a critical dimension of 10–50 nm. The spacers include amorphous carbon.

BRIEF DESCRIPTION OF THE DRAWINGS

Exemplary embodiments will hereafter be described with reference to the accompanying drawings, wherein like numerals denote like elements, and.

DETAILED DESCRIPTION OF EXEMPLARY EMBODIMENTS

Figure 1:
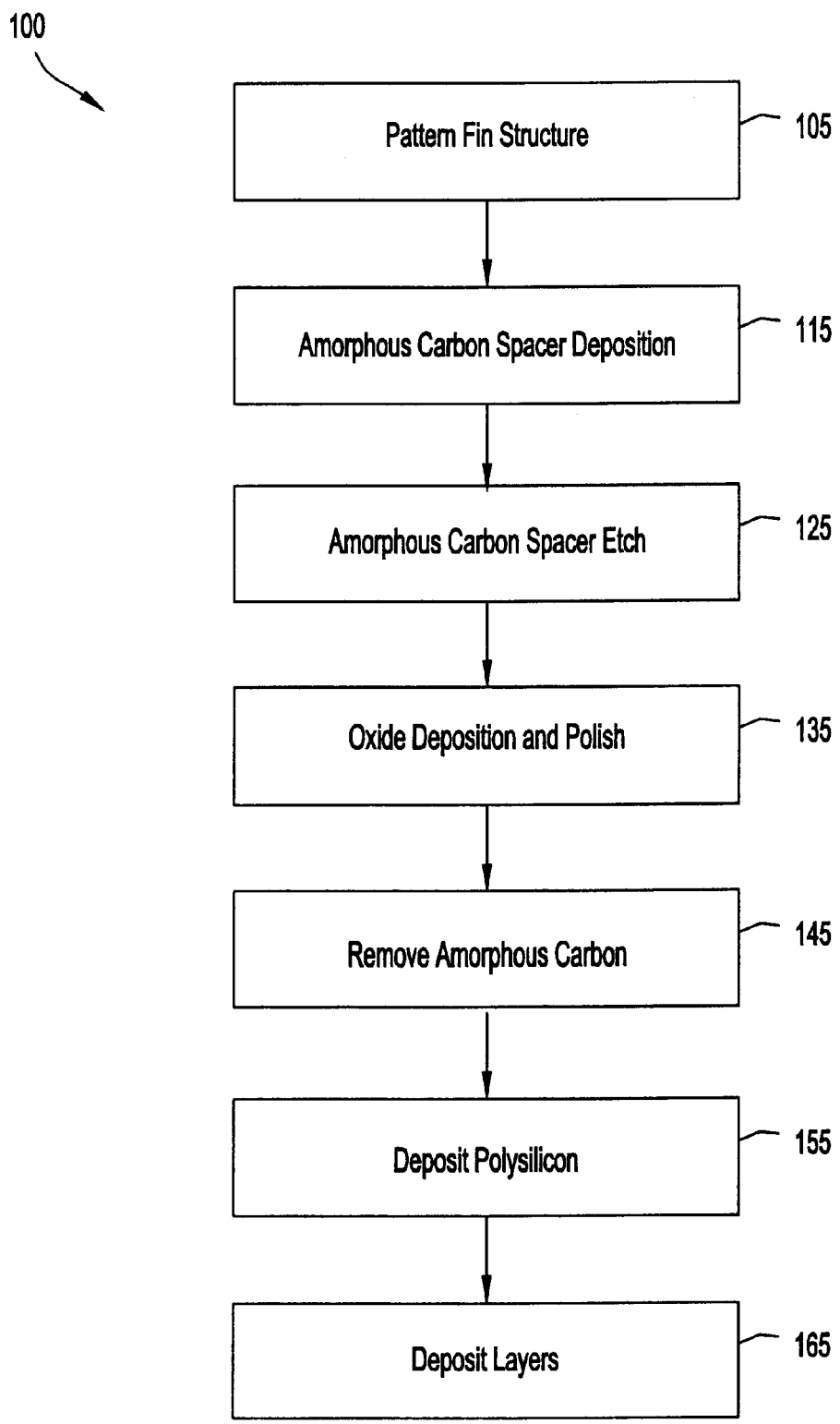
FIG. 1 is a flow diagram depicting exemplary operations in a process for planar finFET patterning using amorphous carbon in accordance with an exemplary embodiment.

FIG. 1 illustrates a flow diagram 100 depicting exemplary operations in a method of patterning a planar finFET using amorphous carbon. Flow diagram 100 illustrates by way of example some operations that may be performed. Additional operations, fewer operations, or combinations of operations may be utilized in various different embodiments.

In an exemplary embodiment, in an operation 105, a fin structure is patterned. The fin structure can have two cross-sectional portions where a top cross-sectional portion includes silicon dioxide ($SiO_2$) and the bottom cross-sectional portion includes silicon (Si). The silicon dioxide top cross-sectional portion can have a cross-sectional thickness of approximately 5–50 nm. The silicon cross-sectional bottom portion can have a cross-sectional thickness of 30–100 nm. The fin structure can have a critical dimension (i.e., cross-sectional width) of approximately 10–50 nm. The fin structure can be patterned over a substrate of silicon dioxide or other suitable material. In one embodiment, the fin structure is single crystal silicon material etched from a silicon-on-insulator substrate. Alternatively, the fin structure can be polysilicon.

In an operation 115, an amorphous carbon layer is deposited over the fin structure and the substrate. The amorphous carbon layer can have a thickness of 50–100 nm. In an exemplary embodiment, the amorphous carbon layer can be deposited using a chemical vapor deposition (CVD) process.

In an operation 125, the amorphous carbon layer is etched to form spacers along lateral side walls of the fin structure. The spacer etch operation can be performed using a variety of etching techniques, including for example oxygen plasma etching or reactive ion etching.

In an operation 135, an oxide deposition and polish operation is performed. In an exemplary embodiment, an oxide layer, such as, silicon dioxide is deposited over the substrate, fin structure, and amorphous carbon spacers. After the oxide is deposited, the oxide is polished to be co-planar with top portions of the amorphous carbon spacers and the fin structure.

In an operation 145, the amorphous carbon spacers are removed. In an exemplary embodiment, the amorphous carbon spacers are removed using an ashing operation in which an $O_2$ plasma is introduced. The ashing operation is advantageous over traditional procedures because it avoids the need for a stripping operation.

In an operation 155, a polysilicon material is deposited over the oxide layer, in locations from which the amorphous carbon spacers were removed, and over the fin structure. In an exemplary embodiment, the deposited polysilicon has a thickness above the oxide layer of approximately 30–100 nm. The deposited polysilicon may need to be polished in order to achieve a flat top surface. In at least one embodiment, before deposition of the polysilicon, a gate dielectric deposition operation is performed in which gate dielectrics are formed along lateral sidewalls of the fin structure. The gate dielectric structures can have a thickness of between 0.5–1.5 nm. High K gate dieletrics can be thicker from 1–20 nm thick.

In an operation 165, various layers are deposited over the deposited polysilicon layer. In an exemplary embodiment, an amorphous carbon layer is deposited over the polysilicon layer and a silicon oxynitride (SiON) or silicon rich nitride (SiRN) layer is deposited above the amorphous carbon layer and a photoresist layer is deposited above the silicon oxynitride layer. Using these deposited layers, a gate structure can be patterned and formed.

Figure 2:
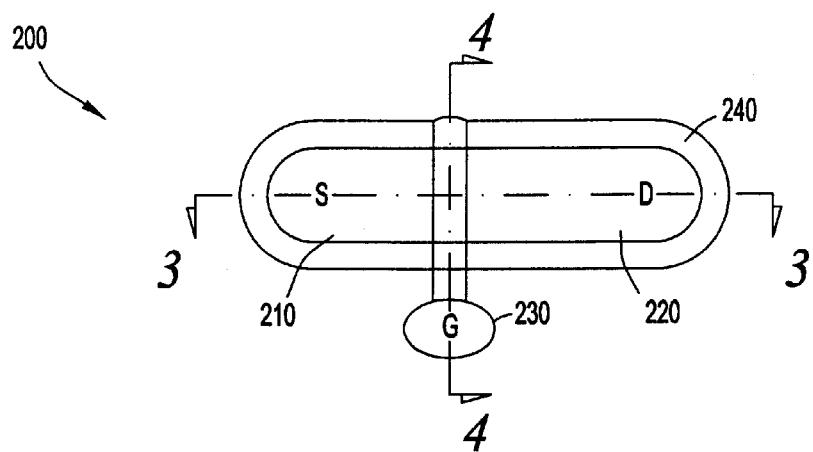
FIG. 2 is a general schematic planar top view representation of a portion of an integrated circuit in accordance with an exemplary embodiment.

FIG. 2 illustrates a top view of a portion 200 of a finFET structure. Portion 200 can include a source region 210, a drain region 220, a gate structure 230, and a spacer location 240. Spacer location 240 illustrates the location of the amorphous carbon spacer prior to removal and subsequent processing to form gate structure 230. An exemplary spacer formation process is described with reference to FIG. 1. To further illustrate portion 200, a cross-section A—A of portion 200 is described below with reference to FIG. 3. Similarly, a cross-section B—B of portion 200 is described below with reference to FIG. 4.

Figure 3:
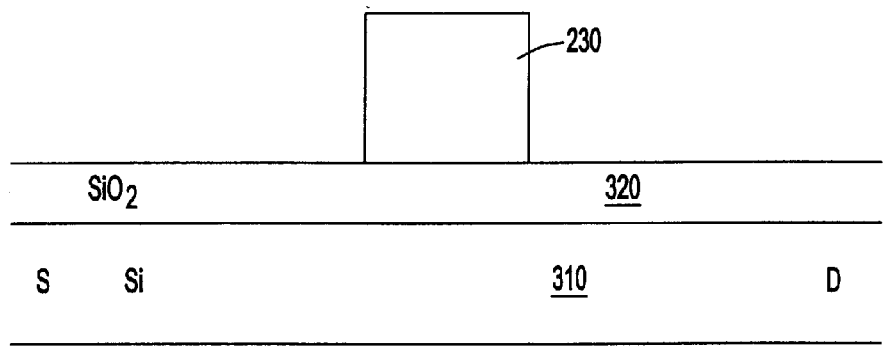
FIG. 3 is a schematic cross-sectional view representation of the portion of the integrated circuit illustrated in FIG. 2 about line 3—3 in accordance with an exemplary embodiment.

FIG. 3 illustrates portion 200 described above with reference to FIG. 2 along a cross-section 3—3. As shown in FIG. 3, gate structure 230 can have a critical dimension of approximately 40 nm. Further, gate structure 230 can be located above a silicon dioxide layer 320 and a silicon layer 310. In an exemplary embodiment, source region 210 and drain region 220 are located in silicon layer 310.

Figure 4:
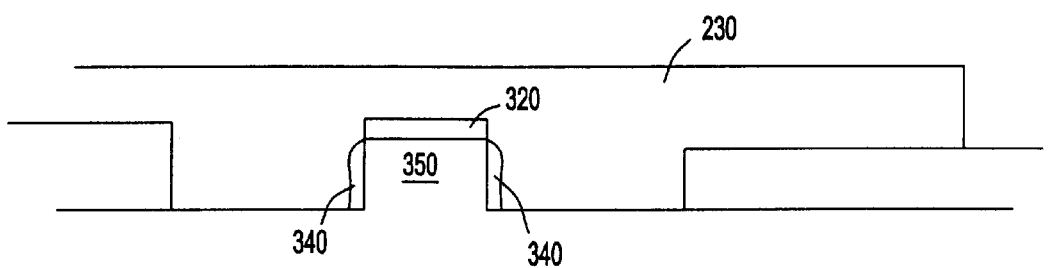
FIG. 4 is a schematic cross-sectional view representation of the portion of the integrated circuit illustrated in FIG. 2 about line 4—4 in accordance with an exemplary embodiment.

FIG. 4 illustrates portion 200 described above with reference to FIG. 2 along a cross-section 4—4. Gate structure 230 includes polysilicon material located in spacer location 240, representing the location where spacers were located prior to their removal. Gate dielectric structures 340 are also present along lateral sidewalls of a fin structure 350. Fin structure 350 includes two portions, a top silicon dioxide portion 320 and a bottom silicon portion 310.

Figure 5:
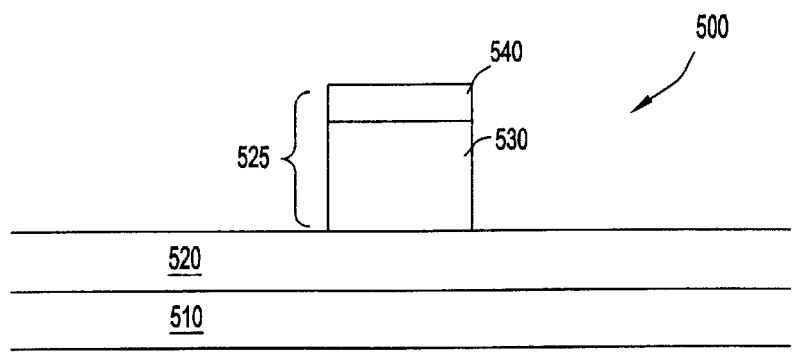
FIG. 5 is a cross-sectional view representation of a portion of an integrated circuit, showing a fin patterning operation.

FIG. 5 illustrates a cross-sectional view representation of a portion 500 of an integrated circuit. Portion 500 includes a silicon substrate layer 510, a silicon dioxide layer 520, and a fin structure 525. Fin structure 525 can include a silicon layer 530 and a silicon dioxide layer 540. Fin structure 525 can have a critical dimension (cross-sectional width) of approximately 10–50 nm. Silicon portion 530 can have a cross-sectional height of approximately 30–100 nm and silicon dioxide portion 540 can have a cross-sectional height of approximately 5–50 nm.

Fin structure 525 can include layers of other materials besides silicon and silicon dioxide. For example, a bottom portion can be silicon-geranium, germanium, gallium arsinide, or other crystalline semiconductor and a top portion can be silicon nitride, silicon carbide, or other dielectric material.

Figure 6:
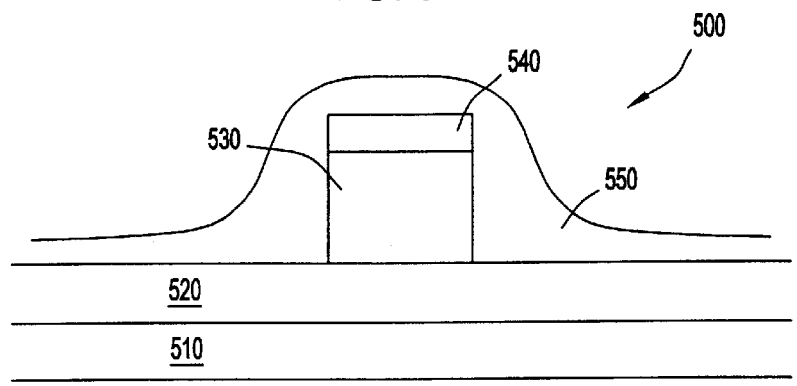
FIG. 6 is a cross-sectional view representation of the portion of the integrated circuit illustrated in FIG. 5, showing a spacer deposition operation.

FIG. 6 illustrates portion 500 after deposition of an amorphous carbon layer 550. Amorphous carbon layer 550 can have a cross-sectional thickness of approximately 50–100 nm. In an exemplary embodiment, amorphous carbon layer 550 is deposited using a chemical vapor deposition (CVD) process which provides for a deposition of amorphous carbon layer 50 over silicon dioxide layer 520 and fin structure 525. PECVD deposition of diamond-like carbon (DLC) or amorphous carbon can be performed in plasmas sustained by rf excitation but DC discharge systems, microwave plasmas, and ECR systems can also be used. High-density plasma (HDP) tools have been used for deposition of modified DLC films. PECVD deposition of DLC and related films can be performed in systems using parallel-plate reactors.

Figure 7:
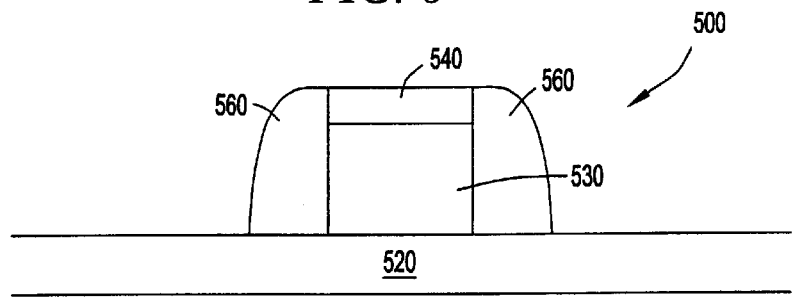
FIG. 7 is a cross-sectional view representation of the portion of the integrated circuit illustrated in FIG. 5, showing a spacer etch-back operation.

FIG. 7 illustrates portion 500 after an etching operation to form spacers 560. Spacers 560 are formed along lateral sidewalls of fin structure 525. In an exemplary embodiment, spacers 560 have a tapered shape. In an alternative embodiments, spacers 560 can have a rectangular or any other suitable shape. The etching operation to form spacers 560 can be any of a variety of etching techniques, including a plasma dry etch.

The height of spacers 560 can be roughly the height of the fin itself, which can be 20–100 nm tall. The width of the fin is roughly the thickness of the deposited amorphous carbon film with a range of 40–100 nm. Spacers 560 can be big enough to be sacrificially removed later, but small enough to be later effectively filled by the polysilicon or other gate electrode material.

Figure 8:
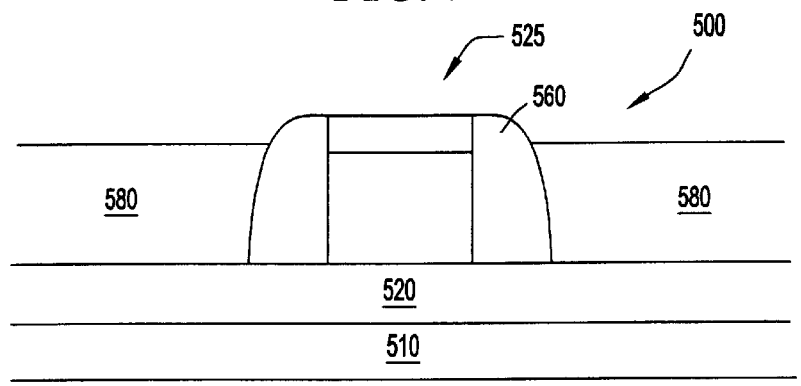
FIG. 8 is a cross-sectional view representation of the portion of the integrated circuit illustrated in FIG. 5, showing a deposition and polish operation.

FIG. 8 illustrates portion 500 after deposition and polishing of an oxide layer 580. Oxide layer 580 can be silicon dioxide. Preferably, oxide layer 580 is deposited over silicon dioxide layer 520, spacers 560, and fin structure 525. After deposition of the oxide layer 580, a polishing of oxide layer 580 is performed to make oxide layer 580 co-planer with spacers 560 and fin structure 525. Oxide layer 580 can be 40–100 nm (roughly the thickness of the silicon fin) thick and deposited by CVD, such as in a TEOS process.

Figure 9:
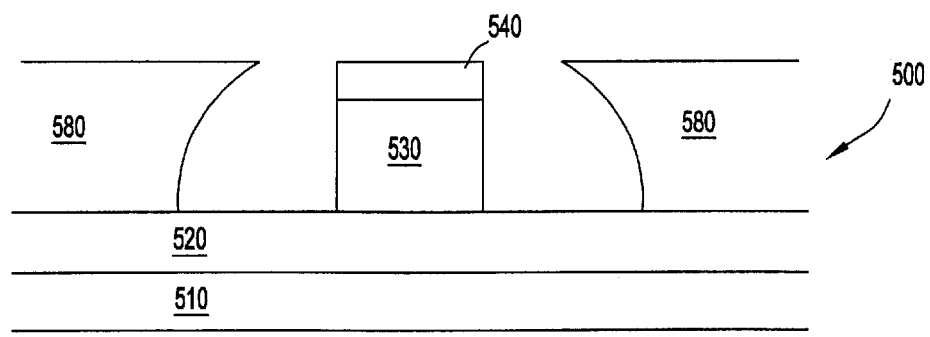
FIG. 9 is a cross-sectional view representation of the portion of the integrated circuit illustrated in FIG. 5, showing a removal operation.

FIG. 9 illustrates portion 500 after a removal operation. In an exemplary embodiment, a removal operation of amorphous carbon includes an ashing procedure in which $O_2$ plasma is introduced, which removes amorphous carbon without damaging surrounding materials. A simply oxygen plasma quickly etches the amorphous carbon, but has little to no effect on any other materials.

Figure 10:
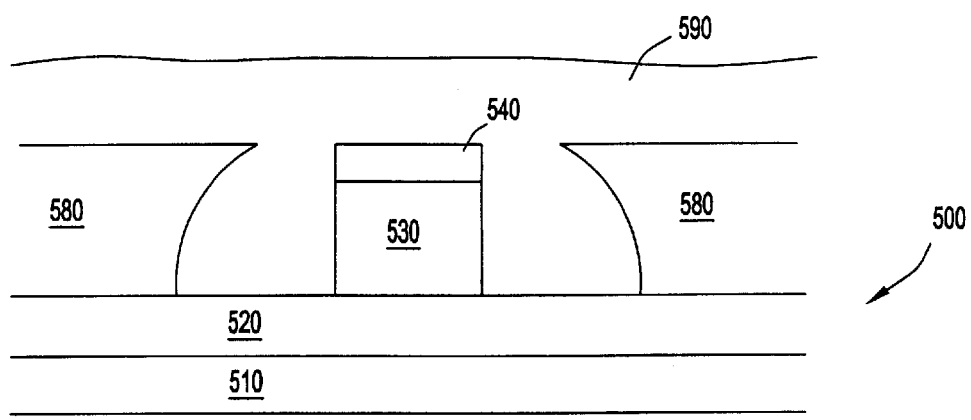
FIG. 10 is a cross-sectional view representation of the portion of the integrated circuit illustrated in FIG. 5, showing a polysilicon deposition operation.

FIG. 10 illustrates portion 500 after a polysilicon deposition operation is performed to provide polysilicon layer 590. In an exemplary embodiment, polysilicon is deposition in locations from which amorphous carbon spacers 560 were removed during the ashing process described with reference to FIG. 9. Polysilicon can be deposited directly using LPCVD furnace process with thermal decomposition of DCS (dichlorosilane) or amorphous silicon can be deposited in a PECVD and later annealed to make the poly crystalline grains appear. The polysilicon layer 590 can have a thickness above oxide layer 580 of approximately between 30–100 nm. In an exemplary embodiment, it may be necessary to polish polysilicon layer 590 to be flat or planar.

Figure 11:
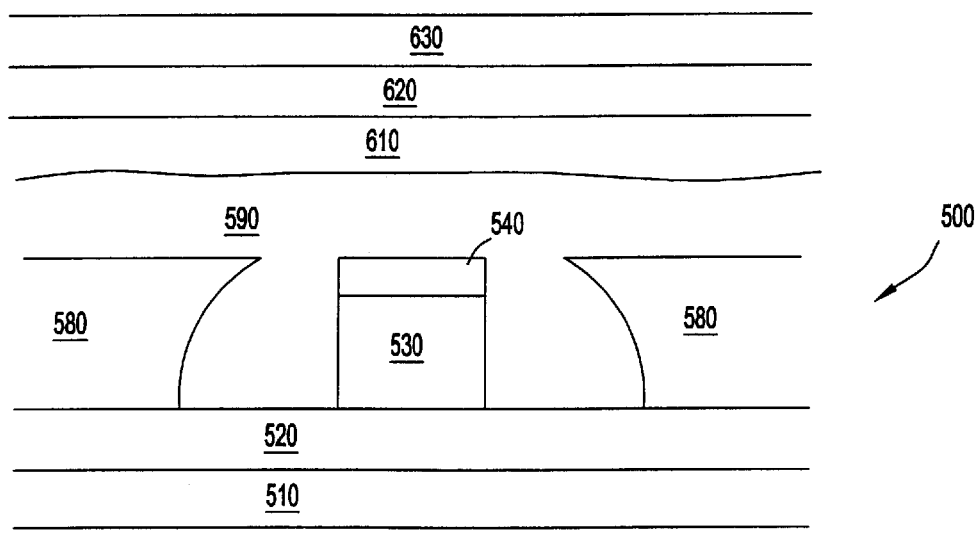
FIG. 11 is a. cross-sectional view representation of the portion of the integrated circuit illustrated in FIG. 5, showing an ARC deposition operation.

FIG. 11 illustrates portion 500 after a deposition operation. In an exemplary embodiment, amorphous carbon layer 610, silicon oxynitride layer 620, and photoresist layer 630 are deposited. Layers 610, 620, and 630 can be deposited using many of a variety of different techniques. For example; a chemical vapor deposition process can be employed to deposit the layers. Layers 610, 620, and 630 can be used during subsequent processing to form a gate structure similar to gate structure 230 described with reference to FIGS. 2–4.

Advantageously, the planar substrate for the poly patterning improves lithography control and also means less over etch time required for the BARC, amorphous carbon, and poly etch. Both the lithography and etch of the gate later for the fin FET devices has been troublesome. Further, advantages of using the amorphous carbon/SiON hardmask scheme also apply here. Smaller CDs can be enabled by the double selectivity switch and the thin transfer layers.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. Various changes may be made to the details disclosed without departing from the spirit of the invention which is defined by the following claims.

What is claimed is:

1. A method of finFET patterning, the method comprising:
    patterning a fin structure above a substrate;
    forming amorphous carbon spacers along lateral sidewalls of the fin structure;
    depositing an oxide layer and polishing the oxide layer to expose top portions of the fin structure and the amorphous carbon spacers;
    removing the amorphous carbon spacers; and
    depositing polysilicon where the amorphous carbon spacers were located.

2. The method of claim 1, wherein forming the amorphous carbon spacers along lateral sidewalls of the fin structure includes depositing an amorphous carbon material over the fin structure and etching the amorphous carbon material to form amorphous carbon spacers.

3. The method of claim 2, wherein the amorphous carbon material has a thickness of 50–100 nm.

4. The method of claim 1, wherein the fin structure includes a silicon (Si) portion and a silicon dioxide ($SiO_2$) portion.

5. The method of claim 4, wherein the silicon portion has a cross-sectional thickness of 30–100 nm and the silicon dioxide portion has a cross-sectional thickness of 5–50 nm.

6. The method of claim 4, further comprising forming a gate dielectric along lateral sides of the Si portion of the fin structure after removal of the amorphous carbon spacers.

7. The method of claim 1, wherein the substrate includes silicon dioxide ($SiO_2$).

8. The method of claim 1, wherein the deposited polysilicon is deposited above the oxide layer to have a cross-sectional thickness above the oxide layer of 30–100 nm.

9. The method of claim 8, further comprising depositing layers of amorphous carbon, silicon oxynitride (SiON), and photoresist.

10. A method of FinFET gate patterning, the method comprising:

providing amorphous carbon spacers adjacent a fin structure;

providing a layer of oxide adjacent the amorphous carbon spacers;

removing the amorphous carbon spacers; and forming a gate structure above the fin structure and where the amorphous carbon spacers were located.

11. The method of claim 10, wherein removing the amorphous carbon spacers includes ashing away the amorphous carbon spacer using an $O_2$ plasma.

12. The method of claim 10, wherein the fin structure has a dimension of 5–50 nm.

13. The method of claim 10, further comprising forming a gate dielectric structure along sidewalls of the fin structure after removal of the amorphous carbon spacers.

14. The method of claim 13, wherein the gate dielectric structures have a cross-sectional thickness of 0.5–1.5 nm.

15. The method of claim 10, wherein the amorphous carbon spacers have a tapered shape.

16. A patterning method comprising:

forming a fin structure having a silicon portion and silicon dioxide portion, the fin structure having a dimension of 10–50 nm;

forming amorphous carbon spacers adjacent lateral sidewalls of the fin structure, forming a layer adjacent to and co-planar with the spacers;

removing the spacers; and depositing polysilicon where the spacers were located.

17. The method of claim 16, wherein the spacers are provided from a layer of amorphous carbon having a cross-sectional thickness of 50–100 nm that is etched to form the spacers.

18. The method of claim 16, wherein the silicon dioxide portion has a cross-sectional thickness of 5–50 nm.

19. The method of claim 16, wherein removing the spacers includes an ashing process involving $O_2$ plasma.

20. The method of claim 16, further comprising forming a gate structure from the deposited polysilicon where the gate structure has a dimension of approximately 40 nm.

* * * * *